(12) United States Patent
Kim et al.

(10) Patent No.: US 12,154,755 B2
(45) Date of Patent: Nov. 26, 2024

(54) TOROIDAL MOTION ENHANCED ION SOURCE

(71) Applicant: Applied Materials, Inc., Santa Clara, CA (US)

(72) Inventors: June Young Kim, Seoul (KR); Jin Young Choi, Seoul (KR); Yong-Seok Hwang, Seoul (KR); Kyoung-Jae Chung, Seoul (KR); Bon-Woong Koo, Andover, MA (US)

(73) Assignee: Applied Materials, Inc., Santa Clara, CA (US)

( * ) Notice: Subject to any disclaimer, the term of this patent is extended or adjusted under 35 U.S.C. 154(b) by 461 days.

(21) Appl. No.: 17/551,849

(22) Filed: Dec. 15, 2021

(65) Prior Publication Data
US 2023/0187165 A1    Jun. 15, 2023

(51) Int. Cl.
*H01J 37/09* (2006.01)
*C23C 14/48* (2006.01)
(Continued)

(52) U.S. Cl.
CPC .............. *H01J 37/09* (2013.01); *C23C 14/48* (2013.01); *C23C 14/52* (2013.01); *H01J 37/08* (2013.01); *H01J 37/3171* (2013.01)

(58) Field of Classification Search
CPC ........ H01J 37/09; H01J 37/08; H01J 37/3171; H01J 2237/061; H01J 2237/082; H01J 27/024; H01J 37/14; H01J 37/145; H01J 2237/0815; H01J 27/022; H01J 37/3211; H01J 1/22; H01J 27/205; H01J 2237/0807; H01J 2237/0805; H01J 27/146; H01J 37/317; H01J 37/06; H01J 2237/31701; C23C 14/48; C23C 14/52; H05H 1/03
See application file for complete search history.

(56) References Cited

U.S. PATENT DOCUMENTS

| | | | |
|---|---|---|---|
| 9,230,773 B1 * | 1/2016 | Likhanskii | ............ H01J 27/024 |
| 10,037,877 B1 | 7/2018 | Vanderberg et al. | |

(Continued)

FOREIGN PATENT DOCUMENTS

| | | |
|---|---|---|
| JP | 2014-232588 A | 12/2014 |
| TW | 201905956 A | 2/2019 |
| WO | 2021/168111 A1 | 8/2021 |

OTHER PUBLICATIONS

International Search Report and Written Opinion mailed Apr. 7, 2023 in corresponding PCT application No. PCT/US2022/051139.

*Primary Examiner* — Renan Luque
(74) *Attorney, Agent, or Firm* — Nields, Lemack & Frame, LLC (57) ABSTRACT

An IHC ion source having increased plasma potential is disclosed. In certain embodiments, the extraction plate is biased at a higher voltage than the body of the arc chamber to achieve the higher plasma potential. Shielding electrodes may be utilized to remove the interaction between the biased extraction plate and the plasma. The cross-section of the arc chamber may be circular or nearly circular to facilitate the rotation of electrons in the chamber. In another embodiment, biased electrodes may be disposed in the chamber on opposite sides of the extraction aperture in the height direction. In some embodiments, only one of the electrodes is biased at a voltage greater than the body of the arc chamber.

19 Claims, 8 Drawing Sheets

(51) Int. Cl.
*C23C 14/52* (2006.01)
*H01J 37/08* (2006.01)
*H01J 37/317* (2006.01)

(56) References Cited

U.S. PATENT DOCUMENTS

| | | | |
|---|---|---|---|
| 10,896,799 | B1 | 1/2021 | Becker et al. |
| 10,923,306 | B2 | 2/2021 | Radovanov et al. |
| 2010/0012839 | A1 | 1/2010 | Notte, IV et al. |
| 2013/0249400 | A1* | 9/2013 | Sato ............ H01J 27/024 |
| | | | 315/111.81 |
| 2014/0353517 | A1 | 12/2014 | Kabasawa et al. |
| 2017/0117113 | A1* | 4/2017 | Alvarado ......... H01J 27/024 |
| 2017/0221669 | A1* | 8/2017 | Chaney ........... H01J 27/022 |
| 2018/0166250 | A1* | 6/2018 | Koo ............... H01J 37/14 |
| 2020/0194220 | A1* | 6/2020 | Perel ............. H01J 37/06 |
| 2020/0294750 | A1* | 9/2020 | Radovanov ........ H01J 27/08 |

\* cited by examiner

TOROIDAL MOTION ENHANCED ION SOURCE

FIELD

Embodiments of the present disclosure relate to an ion source, and more particularly, an indirectly heated cathode ion source with at least one biased component disposed in the chamber such that the plasma potential is increased.

BACKGROUND

Various types of ion sources may be used to create the ions that are used in semiconductor processing equipment. For example, an indirectly heated cathode (IHC) ion source operates by supplying a current to a filament disposed behind a cathode. The filament emits thermionic electrons, which are accelerated toward and heat the cathode, in turn causing the cathode to emit electrons into the arc chamber of the ion source. The cathode is disposed at one end of an arc chamber. A repeller may be disposed on the end of the arc chamber opposite the cathode. The cathode and repeller may be biased so as to repel the electrons, directing them back toward the center of the arc chamber. In other embodiments, a cold cathode may be disposed on the opposite end of the arc chamber. In some embodiments, a magnetic field is used to further confine the electrons within the arc chamber. A plurality of sides is used to connect the two ends of the arc chamber.

An extraction aperture is disposed along one of these sides, proximate the center of the arc chamber, through which the ions created in the arc chamber may be extracted.

There are various parameters of interest in an IHC ion source. These include extracted beam current, dopant fractionalization and plasma stability. However, optimizing all of these parameters may be difficult. For example, high extraction currents may reduce plasma stability.

Therefore, it would be beneficial if there were an IHC ion source that overcame these issues. Specifically, it would be advantageous if there were an IHC ion source with improved plasma stability, even at high extraction currents.

SUMMARY

An IHC ion source having increased plasma potential is disclosed. In certain embodiments, the extraction plate is biased at a higher voltage than the body of the arc chamber to achieve the higher plasma potential. Shielding electrodes may be utilized to reduce the interaction between the biased extraction plate and the plasma. The cross-section of the arc chamber may be circular or nearly circular to facilitate the rotation of electrons in the chamber. In another embodiment, biased electrodes may be disposed in the chamber on opposite sides of the extraction aperture in the height direction. In some embodiments, only one of the electrodes is biased at a voltage greater than the body of the arc chamber.

According to one embodiment, an ion source is disclosed. The ion source comprises a chamber, comprising: a body comprising a first end, a second end, a bottom and a plurality of walls; an indirectly heated cathode disposed at a first end of the chamber; an extraction plate comprising an extraction aperture having a width and a height through which ions are extracted, electrically isolated from the body, wherein the body and the extraction plate form a closed volume; one or more shielding electrodes disposed in the closed volume adjacent to and not in physical contact with the extraction plate and electrically connected to the body; and an extraction power supply in communication with the extraction plate, wherein the extraction plate is positively biased relative to the body. In some embodiments, the one or more shielding electrodes are disposed above and below the extraction aperture along the width of the extraction aperture. In some embodiments, an interior surface of the one or more shielding electrodes is curved. In some embodiments, the bottom and the plurality of walls are a unitary component having a curved interior surface, such that the interior surface of the unitary component and the one or more shield electrodes form a circular or nearly circular cross-section in the chamber along a portion of the chamber. In some embodiments, the circular or nearly circular cross-section extends along the width of the extraction aperture. In certain embodiments, the bottom and the plurality of walls are separate components, and further comprising curved electrodes disposed in corners formed between the bottom and each wall, wherein the curved electrodes are electrically connected to the body. In some embodiments, the exposed portions of the interior surface of the bottom, the plurality of walls, the curved electrodes and the one or more shield electrodes form a circular or nearly circular cross-section along a portion of the chamber. In some embodiments, the circular or nearly circular cross-section extends along the width of the extraction aperture. In some embodiments, the extraction plate is biased at a voltage that is 10V to 100V greater than a voltage of the body.

According to another embodiment, an ion implantation system is disclosed. The ion implantation system comprises the ion source described above, a mass analyzer and an acceleration/deceleration stage.

According to another embodiment, an ion source is disclosed. The ion source comprises a chamber, comprising: a body comprising a first end, a second end, a bottom and a plurality of walls; an indirectly heated cathode disposed at a first end of the chamber; an extraction plate electrically connected to the body and comprising an extraction aperture having a width and a height through which ions are extracted, wherein the body and the extraction plate form a closed volume; two electrodes disposed in the closed volume adjacent to the extraction plate, wherein one electrode is disposed above the extraction aperture in a height direction and one electrode is disposed below the extraction aperture in the height direction; and an electrode power supply in communication with a first electrode of the two electrodes, wherein the first electrode is electrically isolated from the body and is positively biased relative to the body, and a second electrode is electrically connected to the body. In some embodiments, the two electrodes comprise plates having a planar interior surface and a planar back surface and arranged parallel to the extraction plate. In some embodiments, the two electrodes comprise plates having a planar interior surface and a planar back surface and disposed at an angle with respect to the extraction plate.

According to another embodiment, an ion source is disclosed. The ion source comprises a chamber, comprising: a body comprising a first end, a second end, a bottom and a plurality of walls; an indirectly heated cathode disposed at a first end of the chamber; an extraction plate electrically connected to the body and comprising an extraction aperture having a width and a height through which ions are extracted, wherein the body and the extraction plate form a closed volume; one or more electrodes disposed in the closed volume, wherein the one or more electrodes are disposed above the extraction aperture and below the extraction aperture in a height direction; and an electrode power supply in communication with at least one of the one or more electrodes, wherein an interior surface of the one or more electrodes is curved, and the one or more electrodes are disposed in or adjacent to corners formed at junctions between the body and the extraction plate. In some embodiments, the bottom and the plurality of walls are a unitary component having a curved interior surface, such that the interior surface of the unitary component and the one or more electrodes form a circular or nearly circular cross-section along a portion of the chamber. In some embodiments, the bottom and the plurality of walls are separate components, and further comprising curved electrodes disposed in corners formed between the bottom and each sidewall, wherein the curved electrodes are electrically connected to the body. In certain embodiments, the exposed portions of the interior surface of the bottom, the plurality of walls, the curved electrodes and the one or more electrodes form a circular or nearly circular cross-section along a portion of the chamber. In some embodiments, the one or more electrodes comprise two electrodes, and the two electrodes are biased at different voltages.

According to another embodiment, an ion implantation system is disclosed. The ion implantation system comprises the ion source described above, a mass analyzer and an acceleration/deceleration stage.

BRIEF DESCRIPTION OF THE FIGURES

For a better understanding of the present disclosure, reference is made to the accompanying drawings, which are incorporated herein by reference and in which.

DETAILED DESCRIPTION

Various embodiments of an IHC ion source in which the plasma potential is manipulated are disclosed. The plasma potential may be increased by biasing one or more components within the arc chamber that are exposed to the plasma at a higher voltage than the rest of the body of the arc chamber.

Figure 1:
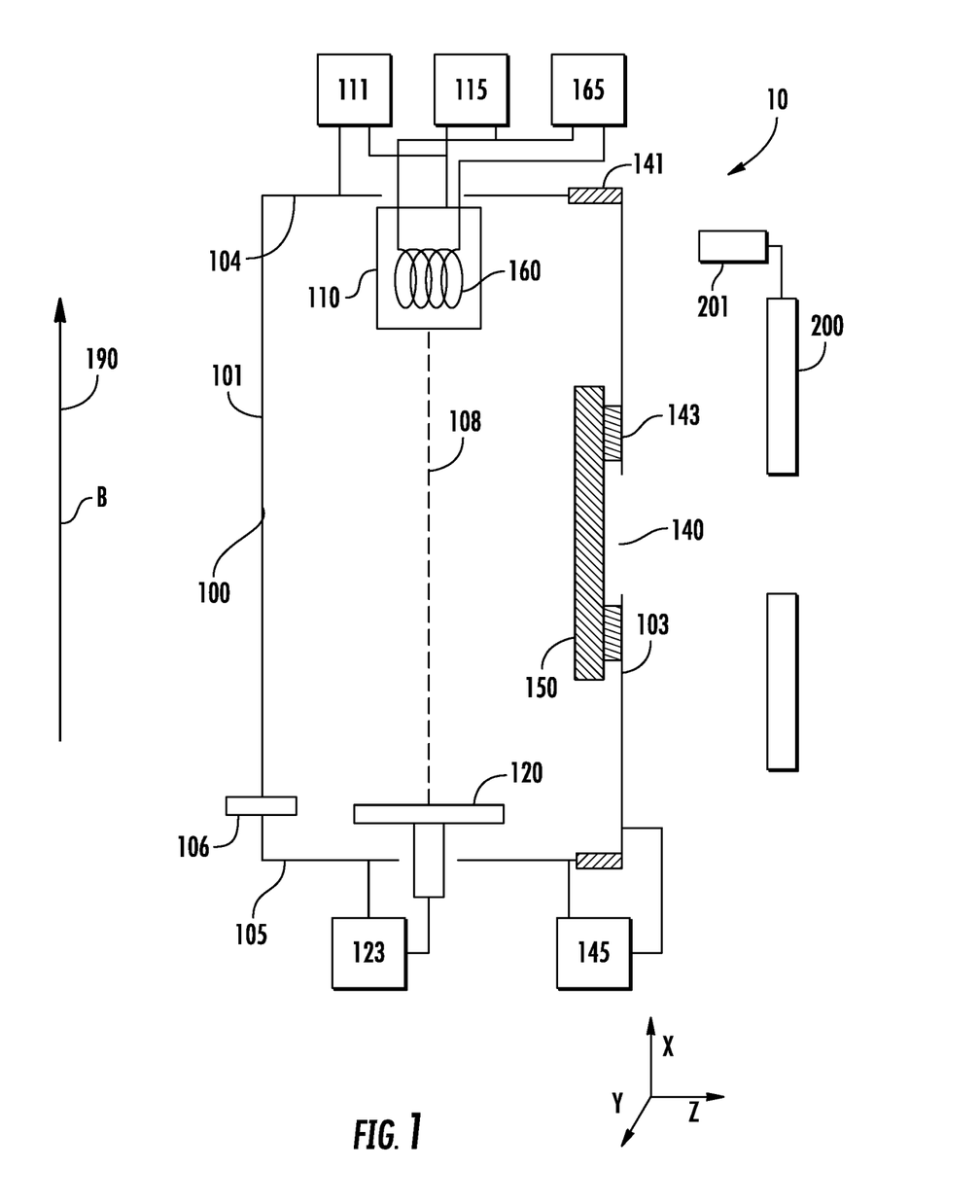
FIG. 1 is an indirectly heated cathode (IHC) ion source in accordance with one embodiment.

FIG. 1 shows an IHC ion source 10 according to one embodiment. The IHC ion source 10 includes an arc chamber 100. The arc chamber 100 has a body, comprising two opposite ends, a bottom and walls 101 connecting to these ends. The direction between the two opposite ends is referred to as the X direction. The direction between the walls 101 is referred to as the Y direction. The direction between the bottom and the extraction plate 103 is referred to as the Z direction. The ends and the walls 101 of the arc chamber 100 may be constructed of an electrically conductive material and may be in electrical communication with one another. In some embodiments, a liner may be disposed proximate one or more of the walls 101. A cathode 110 is disposed in the arc chamber 100 at a first end 104 of the arc chamber 100. A filament 160 is disposed behind the cathode 110. The filament 160 is in communication with a filament power supply 165. The filament power supply 165 is configured to pass a current through the filament 160, such that the filament 160 emits thermionic electrons. Cathode bias power supply 115 biases filament 160 negatively relative to the cathode 110, so these thermionic electrons are accelerated from the filament 160 toward the cathode 110 and heat the cathode 110 when they strike the back surface of cathode 110. The cathode bias power supply 115 may bias the filament 160 so that it has a voltage that is between, for example, 200V to 1500V more negative than the voltage of the cathode 110. The cathode 110 then emits thermionic electrons on its front surface into arc chamber 100.

Thus, the filament power supply 165 supplies a current to the filament 160. The cathode bias power supply 115 biases the filament 160 so that it is more negative than the cathode 110, so that electrons are attracted toward the cathode 110 from the filament 160. In certain embodiments, the cathode 110 may be biased relative to the arc chamber 100, such as by bias power supply 111. In other embodiments, the cathode 110 may be electrically connected to the arc chamber 100, so as to be at the same voltage as the walls 101 of the arc chamber 100. In these embodiments, bias power supply 111 may not be employed and the cathode 110 may be electrically connected to the walls 101 of the arc chamber 100. In certain embodiments, the arc chamber 100 is connected to electrical ground.

On the second end 105, which is opposite the first end 104, a repeller 120 may be disposed. The repeller 120 may be biased relative to the arc chamber 100 by means of a repeller bias power supply 123. In other embodiments, the repeller 120 may be electrically connected to the arc chamber 100, so as to be at the same voltage as the walls 101 of the arc chamber 100. In these embodiments, repeller bias power supply 123 may not be employed and the repeller 120 may be electrically connected to the walls 101 of the arc chamber 100. In still other embodiments, a repeller 120 is not employed.

The cathode 110 and the repeller 120 are each made of an electrically conductive material, such as a metal or graphite. The center of the cathode 110 and the center of the repeller 120 are disposed along the central axis 108.

The components which comprise the body of the arc chamber 100 are all electrically and mechanically coupled to one another. In other words, the first end 104, the second end 105, the bottom and the walls 101 are all at the same electrical potential.

In certain embodiments, a magnetic field 190 is applied along the arc chamber 100 parallel to the X direction. This magnetic field 190 is intended to confine the electrons along one direction. The magnetic field 190 typically runs parallel to the walls 101 from the first end 104 to the second end 105. For example, electrons may be confined in a column that is parallel to the direction from the cathode 110 to the repeller 120 (i.e. the X direction). Thus, electrons do not experience any electromagnetic force to move in the X direction. However, movement of the electrons in other directions may experience an electromagnetic force.

Further, the IHC ion source 10 also comprises a gas inlet 106 through which the feedgas to be ionized may be introduced to the arc chamber 100.

One side of the arc chamber 100 is referred to as the extraction plate 103. The extraction plate 103 includes an extraction aperture 140. In FIG. 1, the extraction aperture 140 is disposed on a side that is parallel to the X-Y plane (perpendicular to the page). The extraction plate 103 is made of an electrically conductive material, such as a metal or graphite. In certain embodiments, the extraction aperture 140 may have a width (i.e. X direction) much greater than its height (i.e. Y direction).

The extraction plate 103 is electrically isolated from the body of the arc chamber 100 through the use of insulators 141. As noted above, the first end 104, the second end 105, the bottom and the walls 101 are maintained at a common potential. This may be ground. However, in other embodiments, these components may be biased using a power supply.

As stated above, the extraction plate 103 is electrically isolated from the body of the arc chamber 100 through the use of insulators 141. Specifically, the insulators 141 may separate the extraction plate 103 from two of the walls 101, the first end 104 and the second end 105. These insulators 141 may be constructed of a dielectric material, such as boron nitride (BN), alumina ($Al_2O_3$) and other materials.

Disposed between the interior of the arc chamber 100 and the extraction plate 103 are one or more shielding electrodes 150. The one or more shielding electrodes 150 may be adjacent to but not in physical contact with the extraction plate 103. In this way, the one or more shielding electrodes 150 may block a portion of the extraction plate 103 from being exposed to the plasma.

Figure 2A:
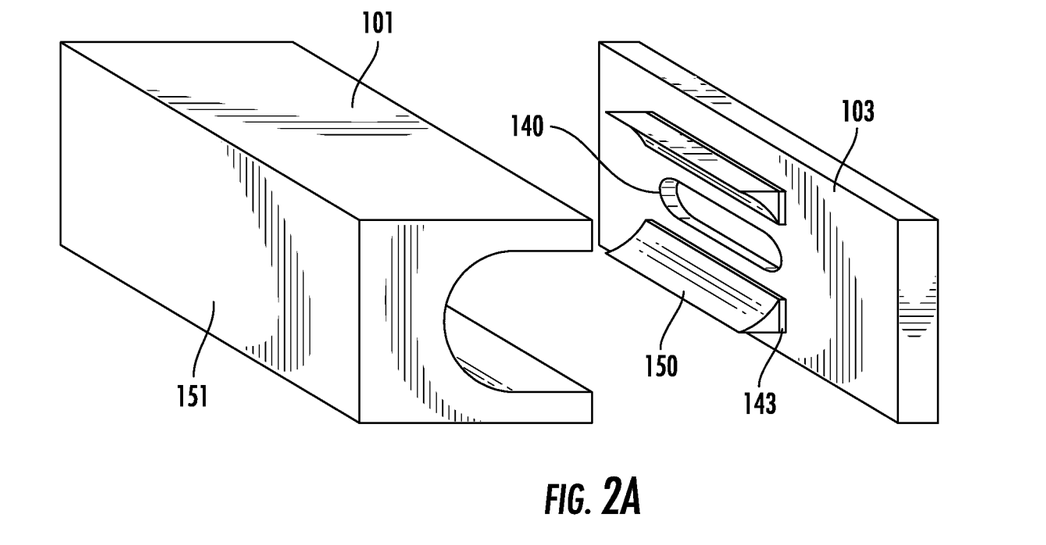
FIG. 2A shows a perspective view of the IHC ion source of FIG. 1 in accordance with one embodiment.

As seen in FIG. 2A, the one or more shielding electrodes 150 may be disposed above and below the extraction aperture 140 in the Y direction. The one or more shielding electrodes 150 may extend the entire width of the extraction aperture 140. In some embodiments, the one or more shielding electrodes 150 may extend beyond the extraction aperture 140 in the X direction. In one embodiment, shown in FIG. 2A, there may be two shielding electrodes 150; one disposed on either side of the extraction aperture 140 in the height direction. In another embodiment, shown in FIG. 2B, the shielding electrode 150 may be a unitary component with an opening that corresponds to the extraction aperture 140.

While the above disclosure describes an extraction aperture having a width that is much greater than the height, other extraction apertures are possible. For example, the extraction aperture 140 may be a round opening. In this example, the one or more shielding electrodes 150 of FIG. 2A may still be disposed on both sides of the extraction aperture 140 in the height direction. In one embodiment, there may be two shielding electrodes 150; one disposed on either side of the extraction aperture in the height direction (i.e. the Y direction). These shielding electrodes 150 may extend beyond the round opening in the X direction. In another embodiment, the shielding electrode 150 may be a unitary component with a hole that corresponds to the extraction aperture 140, similar to that shown in FIG. 2B. For example, the unitary component may be round, square, diamond shaped, a rectangle, or any other shape with a hole.

The one or more shielding electrodes 150 may be shaped so as to form a curved interior surface facing the arc chamber 100. The curved interior surface may be concave. Further, the shielding electrodes 150 are electrically isolated from the extraction plate 103, such as by the use of an insulator 143 or a gap between the one or more shielding electrodes 150 and the extraction plate 103. These insulators 143 may be constructed of a dielectric material, such as boron nitride (BN), alumina ($Al_2O_3$) and other materials.

The one or more shielding electrodes 150 may be constructed from a refractory metal and are electrically conductive. The one or more shielding electrodes 150 may be biased at the same potential as the body of the arc chamber 100. In certain embodiments, when the arc chamber 100 is assembled, the one or more shielding electrodes 150 contact the body of the arc chamber 100. The term "the body of the arc chamber" refers to the first end 104, the second end 105, the bottom and the walls 101. The one or more shielding electrodes 150 may be in physical and/or electrical contact with the body so as to have the same voltage as the body. In one embodiment, the one or more shielding electrodes 150 are in physical contact with the body. In another embodiment, the one or more shielding electrodes are electrically connected to the body, such as by a wire or conductive material 144, as shown in FIGS. 3A and 3B.

Figure 2B:
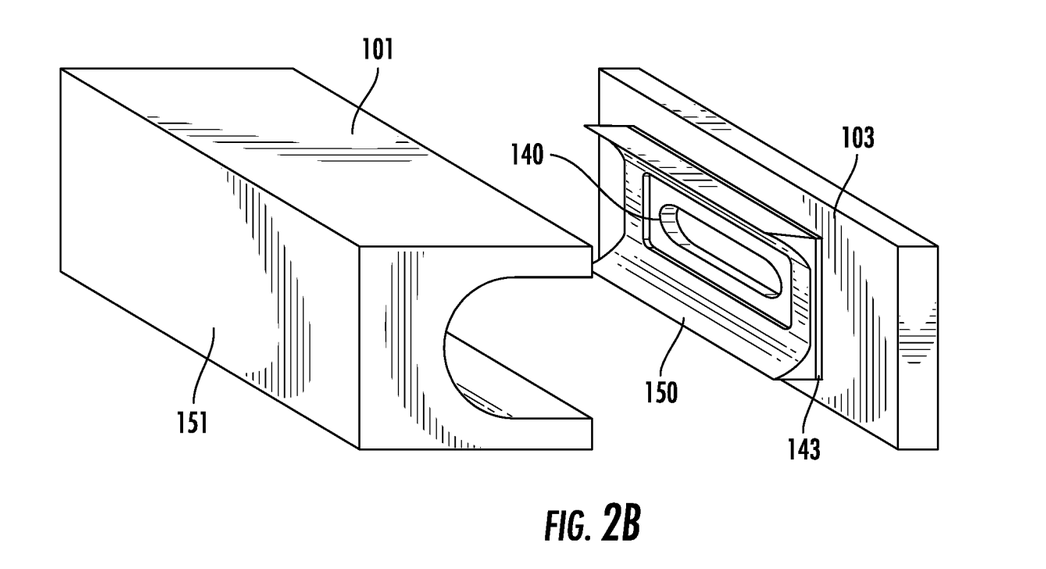
FIG. 2B shows a perspective view of the IHC ion source of FIG. 1 in accordance with another embodiment.
Figure 3A:
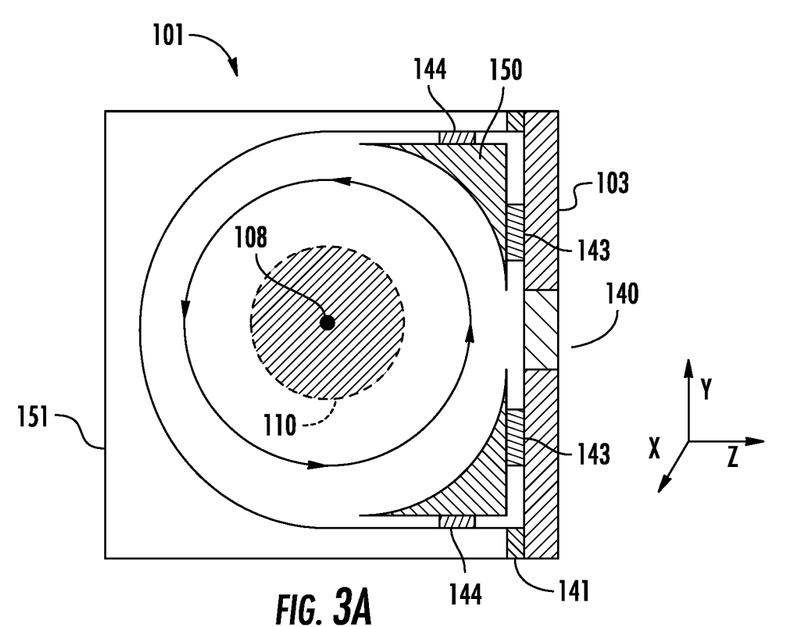
FIGS. 3A-3B shows a cross section view of the IHC ion source of FIG. 1 according to two embodiments.

In certain embodiments, such as those shown in FIG. 2A, FIG. 2B and FIG. 3A, a portion of the body, specifically the bottom and the plurality of walls, comprises a unitary component 151 having a bottom, which is opposite the extraction plate 103, and two walls. The direction between the bottom and the extraction plate 103 is referred to as the Z direction. In this embodiment, the unitary component 151 may have a U-shaped interior surface.

When assembled, the U-shaped interior surface of the unitary component 151 and the interior surfaces of the shielding electrodes 150 may form a circular or nearly circular cross-section in the Y-Z plane along a portion of the arc chamber 100, as shown in FIG. 3A. This circular or nearly circular cross-section may extend along the X direction for the entire width of the extraction aperture 140. The term "nearly circular" is defined to be a configuration where the shortest distance from a central axis 108 to any point on the interior surface of the unitary component 151 or the shielding electrodes 150 differs by less than 30%.

Figure 3B:
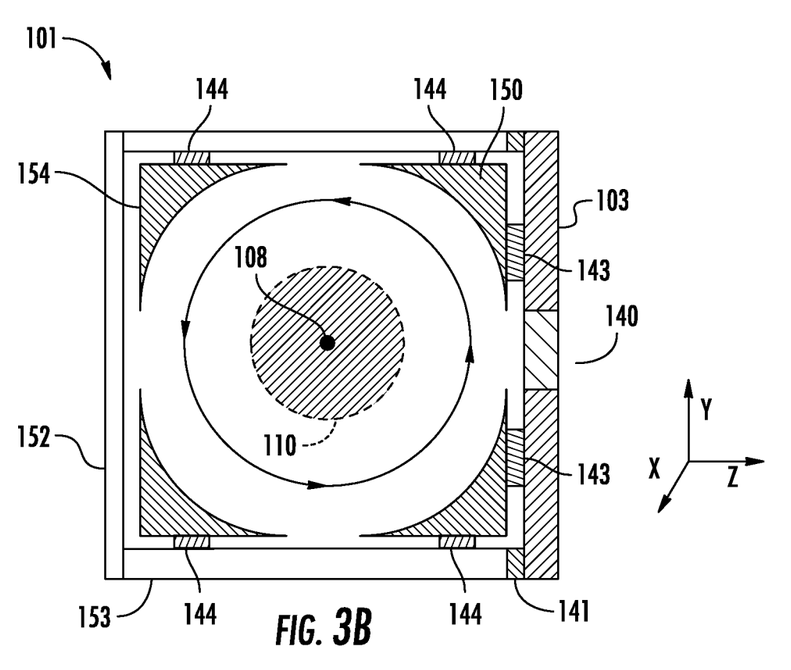

FIG. 3B shows a second configuration. In this embodiment, the walls 101 may be constructed from separate components, such as a bottom 152 and two walls 153. To create the circular or nearly circular cross-section, curved electrodes 154 may be disposed in the corners between the bottom 152 and each of the walls 153. The interior surface of the curved electrodes 154 may be concave. The curved electrodes 154 may be electrical connected to the bottom 152 and the walls 153. In one embodiment, the curved electrodes 154 may rest against the bottom 152 and/or the walls 153. In another embodiment, the curved electrodes 154 are electrically connected to the body, such as by a wire or conductive material 144, as shown in FIG. 3B.

The curved electrodes 154 may extend from the first end 104 to the second end 105. In another embodiment, the curved electrodes 154 extend the entire width of the extraction aperture 140. The curved electrodes 154 may be electrically connected to the body of the arc chamber 100.

The exposed portions of the bottom 152, the walls 153, the curved electrodes 154, and the one or more shielding electrodes 150, form a circular or nearly circular cross-section in the Y-Z plane along a portion of the arc chamber 100. In this embodiment, the term "nearly circular" is defined to be a configuration where the shortest distance from a central axis 108 to any point on the exposed interior surfaces of the bottom 152, the walls 153, the curved electrodes 154 or the shielding electrodes 150 differs by less than 30%.

In operation, when assembled, the extraction plate 103 and the body of the arc chamber 100 form a closed volume. Feedgas enters this closed volume via the gas inlet 106. The feedgas that is introduced into the IHC ion source 10 is ionized to form a plasma. This plasma has an electrical potential, referred to as the plasma potential, which is related to the electrical potential of the walls that form the closed volume.

In this embodiment, the extraction plate 103 is independently biased using extraction power supply 145. In certain embodiments, the extraction power supply 145 is referenced to the body of the arc chamber 100. The extraction power supply 145 may be capable of supplying voltages to the extraction plate 103 that are positive with respect to the body of the arc chamber 100. These voltages may be between 5V and 100V more positive than the body, although other values are also possible.

An extraction plate 103 that is positively biased relative to the body of the arc chamber 100 provides efficient ion source operation at higher plasma density. In this mode, because the extraction plate 103 is biased at a higher potential than the body of the arc chamber 100, the plasma potential is increased to a voltage greater than that of the body of the arc chamber 100. Specifically, near the extraction aperture 140, the plasma potential may be equal to or greater than the voltage applied to the extraction plate 103. Along the central axis 108, the plasma potential is greater than the voltage of the arc chamber 100 and may be roughly 50% to 75% of the voltage applied to the extraction plate 103.

This creates an electrical field in the arc chamber 100 which extends radially outward from the central axis 108. In other words, since the plasma potential is greater than the voltage of the body of the arc chamber 100 and the shielding electrodes 150, there is a voltage gradient in the radial direction. Additionally, as noted previously, there may be a magnetic field 190 that is parallel to the central axis 108.

The radial electrical field and the axial magnetic field 190 result in a rotational force, indicated by the arrows in FIGS. 3A-3B. This rotational force may be optimized by minimizing the surface area of the interior surfaces that are exposed to the plasma and are at a higher voltage than the body. Thus, the use of the one or more shielding electrodes 150 serves two functions. First, the one or more shielding electrodes 150 help form the circular or nearly circular cross-section of the arc chamber 100 in the Y-Z plane along a portion of the arc chamber 100. Second, the one or more shielding electrodes 150 also reduce the surface area of interior surfaces that are exposed to the plasma and have a potential different from the body of the arc chamber 100. In certain embodiments, it may be advantageous to minimize the ratio of the surface area of the extraction plate 103 that is exposed to the plasma (which acts as an anode) to the total surface area within the arc chamber 100 that is exposed to the plasma. In the embodiment shown in FIG. 3A, this total surface area includes the exposed interior surfaces of the one or more shielding electrodes 150, the exposed interior surface of the unitary component 151, first end 104, the second end 105 and the exposed portions of the extraction plate 103. In the embodiment shown in FIG. 3B, this total surface area includes the exposed interior surfaces of the one or more shielding electrodes 150, the exposed interior surfaces of the curved electrode 154, the exposed interior surface of the walls 153, the exposed interior surface of bottom 152, the first end 104, the second end 105, and the exposed portions of the extraction plate 103. In certain embodiments, the ratio of the surface area of the extraction plate 103 that is exposed to the plasma to the total surface area within the arc chamber 100 may be between 0.01 and 0.3. In certain embodiments, the ratio may be between 0.01 and 0.2. In some embodiments, the ratio may be between 0.01 and 0.1.

Figure 4:
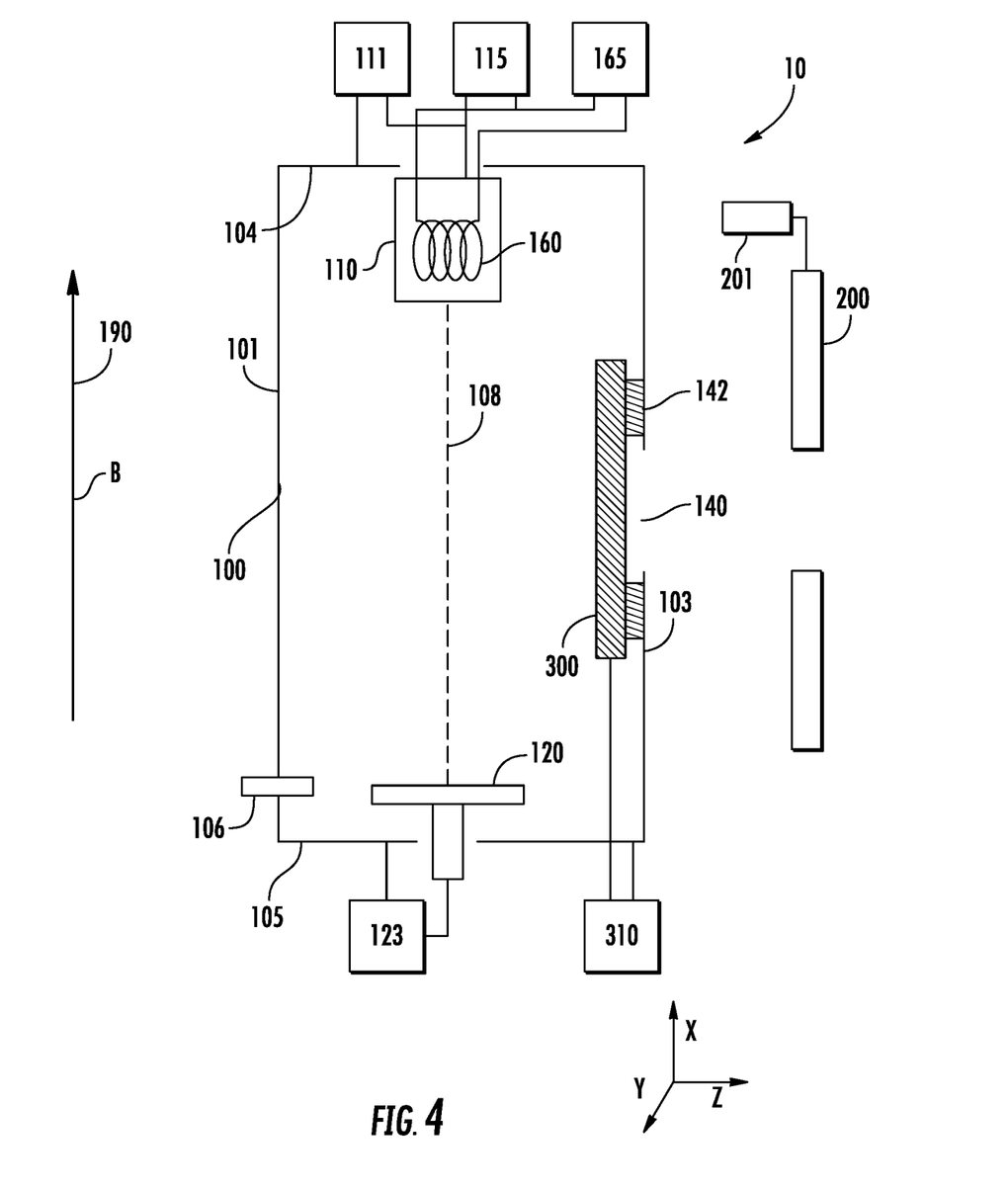
FIG. 4 is an indirectly heated cathode (IHC) ion source in accordance with another embodiment.

FIG. 4 shows an IHC ion source 10 according to another embodiment. In this figure, the components that are identical to those in FIG. 1 have been given the same reference designators. In this embodiment, the extraction plate 103 is electrically connected to the body of the arc chamber 100. The extraction aperture 140 may be a slit having a width much greater than its height.

Thus, in order to increase the plasma potential, one or more electrodes 300 are disposed within the arc chamber 100. In this embodiment, the electrodes 300 may be biased using electrode power supply 310. In certain embodiments, the electrode power supply 310 is referenced to the body of the arc chamber 100. The electrode power supply 310 may be capable of supplying voltages to the electrodes 300 that are positive with respect to the body of the arc chamber 100. These voltages may be between 5V and 100V more positive than the body, although other values are also possible. In this way, one or more of the electrodes 300 may serve as anodes.

Figure 5A:
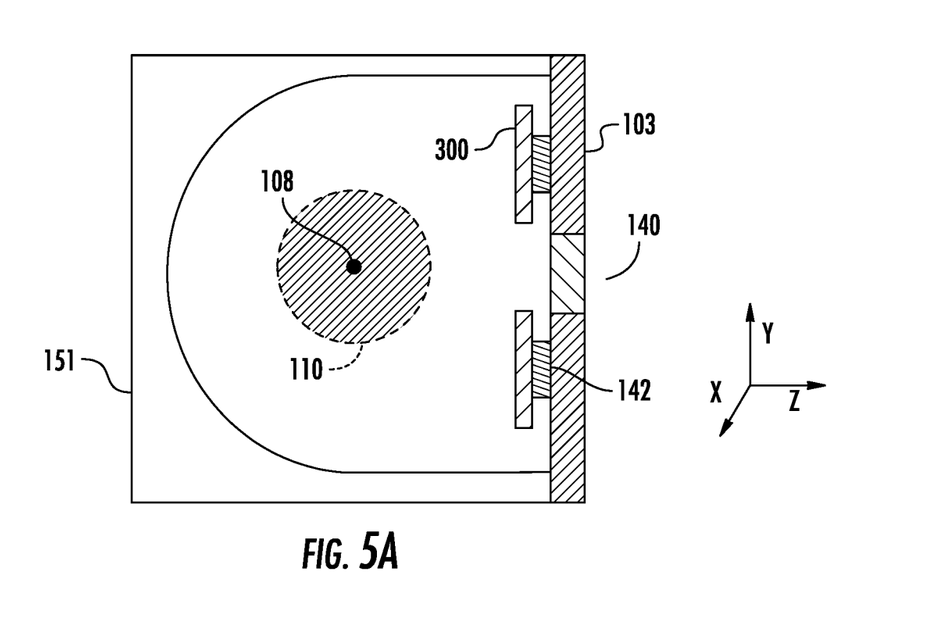
FIGS. 5A-5E shows a cross section view of the IHC ion source of FIG. 4 according to various embodiments.
Figure 5B:
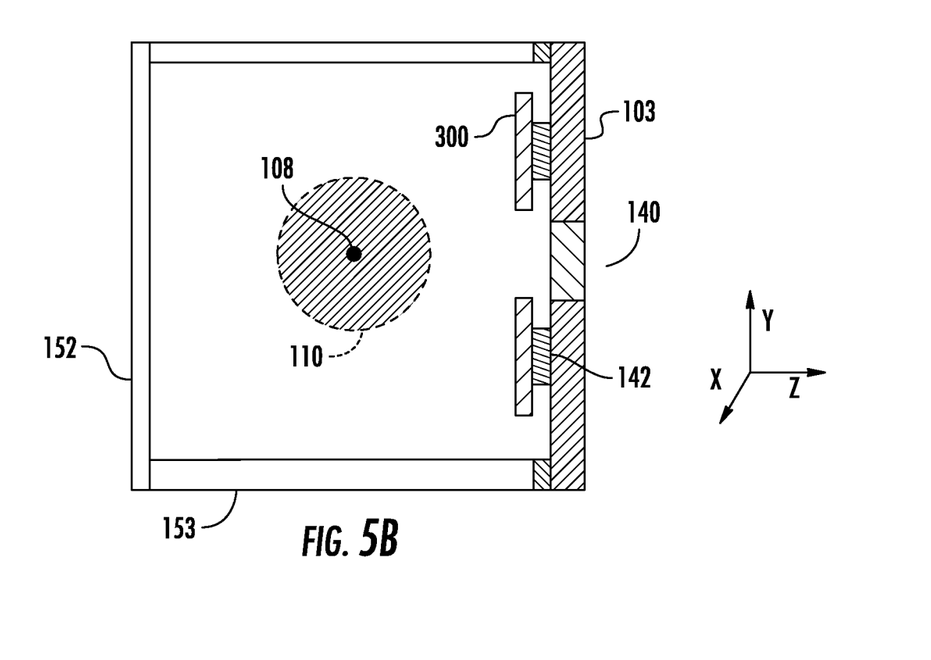

The one or more electrode 300 may be disposed in a variety of different locations within the arc chamber 100. Each location is adjacent to at least a portion of the extraction plate 103. As shown in FIGS. 5A-5B, the one or more electrodes 300 may be disposed adjacent to the extraction plate 103 on opposite sides of the extraction aperture 140 in the height direction or in the width direction. In certain embodiments, the electrodes 300 may have a surface area that is exposed to the plasma that is between 3% and 50% of the interior surface area of the extraction plate 103. In some embodiments, the surface area of the electrodes 300 that is exposed to the plasma may be between 3% and 30% of the interior surface area of the extraction plate 103. In some embodiments, the surface area of the electrodes 300 that is exposed to the plasma may be between 3% and 20% of the interior surface area of the extraction plate 103. In some embodiments, the surface area of the electrodes 300 that is exposed to the plasma may be between 3% and 10% of the interior surface area of the extraction plate 103. The body of the arc chamber 100 may be a unitary component 151, as shown in FIG. 5A. Alternatively, the body of the arc chamber 100 may comprise separate components that make up the bottom 152 and the walls 153, as shown in FIG. 5B. The electrodes 300 may be plates having a planar interior surface facing the plasma and a planar back surface facing the extraction plate 103. In these embodiments, the electrodes 300 are arranged parallel to the extraction plate 103.

Figure 5C:
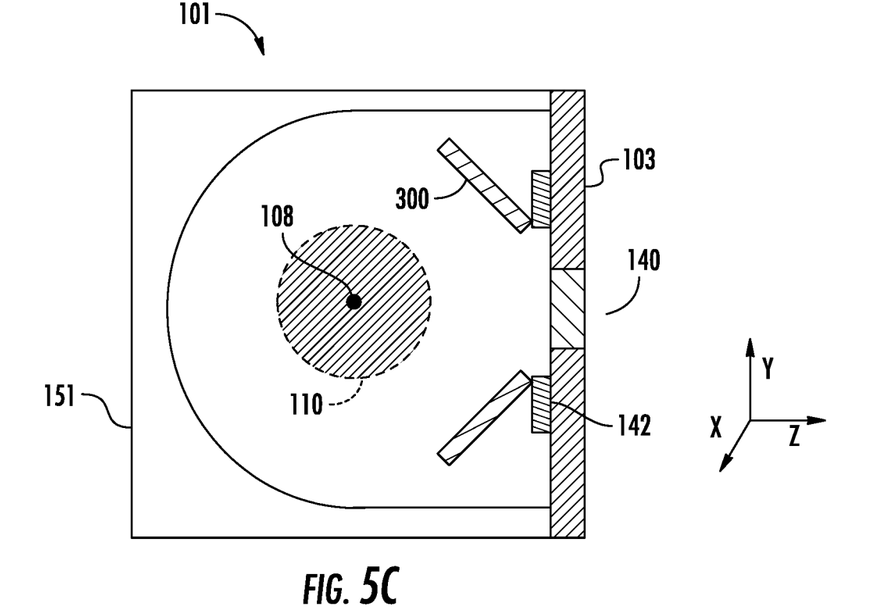

FIG. 5C shows another position for the electrodes 300. In this embodiment, the electrodes 300 are plates, as described above. Additionally, the electrode 300 are disposed at an angle with respect to the extraction plate 103. In one embodiment, the electrodes 300 may form a 450 angle with the extraction plate 103, although other angles are possible. Note that this position of the electrodes 300 may be used with the unitary component 151, as shown in FIG. 5C, or with the body that is made up of separate components, such as that shown in FIG. 5B.

Figure 5D:
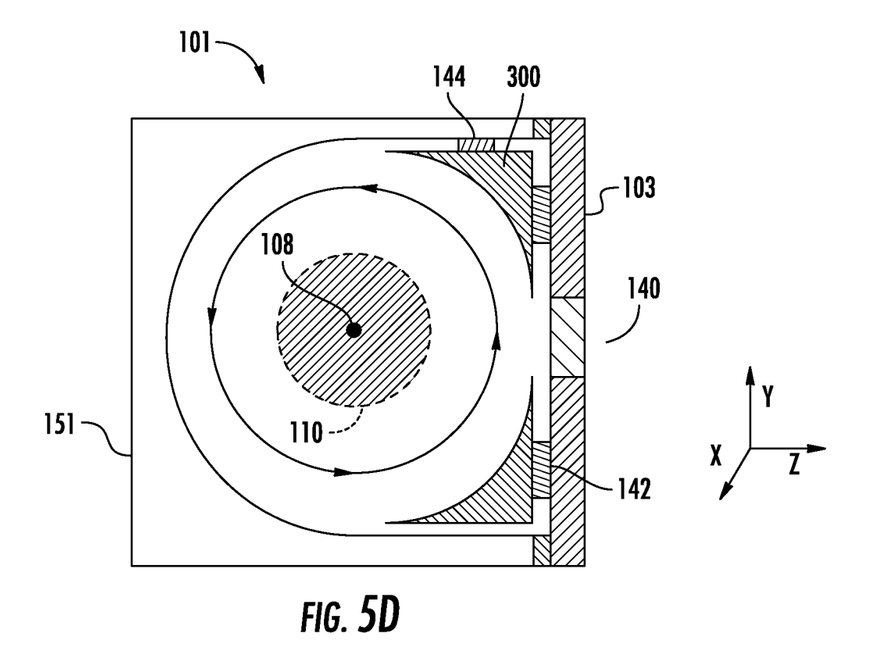
Figure 5E:
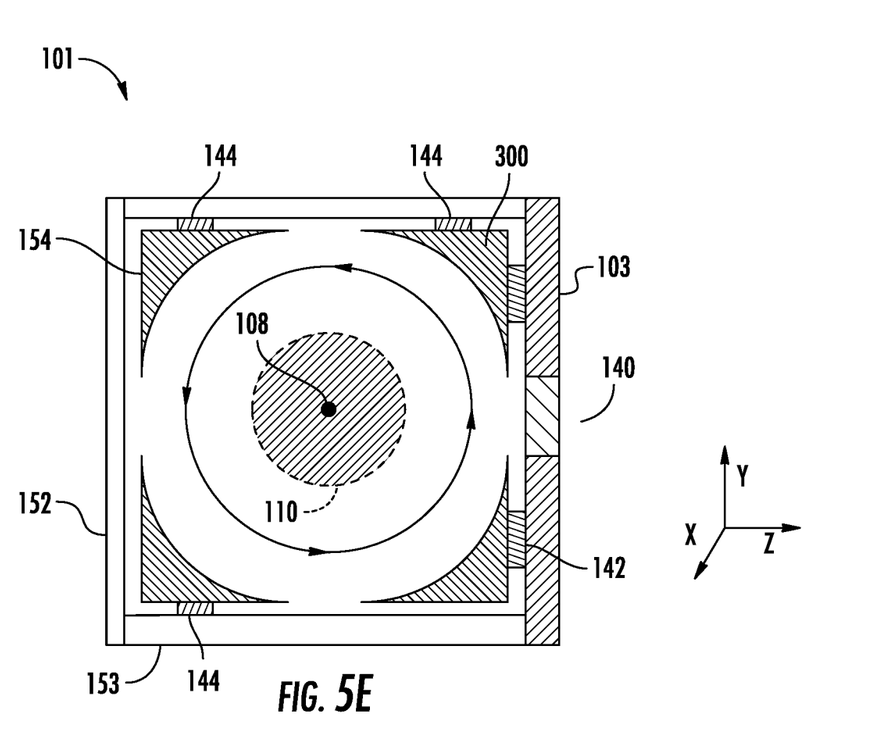

FIGS. 5D-5E shows embodiments where the electrodes 300 are disposed in or adjacent to the corners formed at the junction between the body and the extraction plate 103, and more specifically the junction between the walls and the extraction plate 103. Further, the electrodes 300 may also have a curved interior surface. This curved interior surface may be concave. In the embodiment shown in FIG. 5D, the bottom and walls are a unitary component 151 such that the unitary component 151 and the electrodes 300 form a circular or nearly circular cross section in the Y-Z plane along a portion of the arc chamber 100. The term "nearly circular" is defined to be a configuration where the shortest distance from a central axis 108 to any point on the interior surface of the unitary component 151 or the electrodes 300 differs by less than 30%. In the embodiment shown in FIG. 5E, the body of the arc chamber 100 is formed from separate components, such as bottom 152 and walls 153. In this embodiment, curved electrodes 154, which are electrically connected to the body, may be utilized. In this way, the cross-section of the arc chamber 100 is circular or nearly circular in the Y-Z plane along a portion of the arc chamber 100. In this embodiment, the term "nearly circular" is defined to be a configuration where the shortest distance from a central axis 108 to any point on the exposed interior surfaces of the bottom 152, the walls 153, the curved electrodes 154 or the electrodes 300 differs by less than 30%. The circular or nearly circular cross section may extend along the width of the extraction aperture 140.

In the embodiments shown in FIGS. 5D-5E, the curved interior surfaces promote the rotation of electrons, similar to the operation of the IHC ion source of FIG. 1.

In the embodiments shown in FIGS. 5A-5E, the one or more electrodes 300 may be disposed above and below the extraction aperture 140 in the Y direction. The electrodes 300 may extend the entire width of the extraction aperture 140. In some embodiments, the electrodes 300 may extend beyond the extraction aperture 140 in the X direction. In one embodiment, there may be two electrodes 300; one disposed on either side of the extraction aperture 140 in the height direction. In another embodiment, where the electrodes are commonly biased, the electrode 300 may be a unitary component with an opening that corresponds to the extraction aperture 140.

In the embodiments shown in FIG. 5A-5E, the one or more electrodes 300 may be positively biased relative to the body of the arc chamber 100 using a common electrode power supply 310. In another embodiment, two electrodes 300 are utilized and only one of the two electrodes 300 may be biased, while the other is electrically connected to the arc chamber 100. In another embodiment, the two electrodes 300 may be biased using two different electrode power supplies. For example, the second electrode may be biased at the same voltage, a greater voltage or a smaller voltage than the first electrode. Further, in certain embodiments, one of the electrodes 300 may be biased negatively relative to the arc chamber 100. Specifically, if one or more of the electrodes 300 is biased at a voltage different from the body, it may be electrically isolated from the extraction plate 103 and the body through the use of a gap or through the use of insulators 142. Specifically, the insulators 142 may separate the extraction plate 103 from the electrodes 300 or separate the body from the electrodes 300. These insulators 142 may be constructed of a dielectric material, such as boron nitride (BN), alumina ($Al_2O_3$) and other materials. If one of the electrodes 300 is at the same voltage as the body, it may be in physical and/or electrical contact with the body or the extraction plate 103, such as by a wire or conductive material 144, as shown in FIGS. 5D and 5E.

The curved electrodes 154 may be electrical connected to the bottom 152 and the walls 153. In one embodiment, the curved electrodes 154 may rest against the bottom 152 and/or the walls 153. In another embodiment, the curved electrodes 154 are electrically connected to the body, such as by a wire or conductive material 144, as shown in FIG. 5E.

While the above disclosure describes an extraction aperture having a width that is much greater than the height, other extraction apertures are possible. For example, the extraction aperture 140 may be a round opening. In this example, the one or more electrodes 300 of FIGS. 5A-5E may still be disposed on both sides of the extraction aperture 140 in the height direction. In one embodiment, there may be two electrodes 300; one disposed on either side of the extraction aperture in the height direction (i.e. the Y direction). These electrodes 300 may extend beyond the round opening in the X direction. In another embodiment, where the electrodes 300 are commonly biased, the electrode 300 may be a unitary component with a hole that corresponds to the extraction aperture 140. For example, the unitary component may be round, square, diamond shaped, a rectangle, or any other shape with a hole.

In certain embodiments, the ratio of the surface area of the one or more electrodes 300 that are positively biased and that is exposed to the plasma to the total surface area within the arc chamber 100 may be between 0.01 and 0.3. In certain embodiments, the ratio may be between 0.01 and 0.2. In some embodiments, the ratio may be between 0.05 and 0.2.

Figure 6:
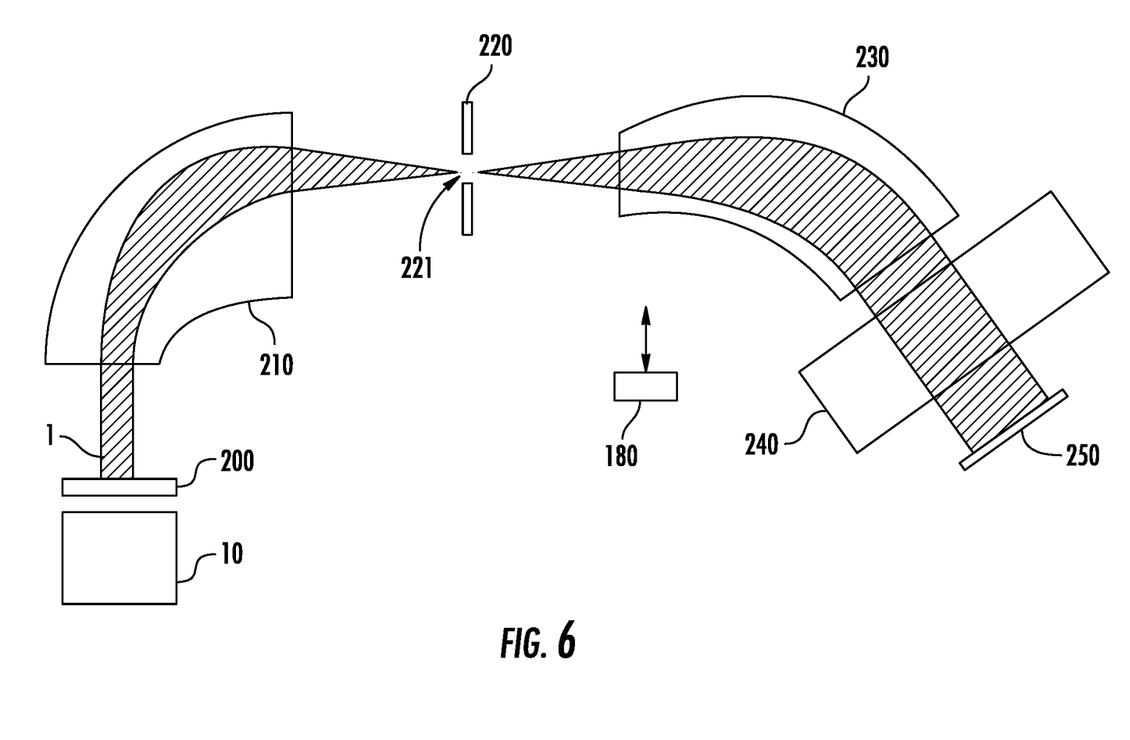
FIG. 6 shows an ion implantation system utilizing the IHC ion source of FIG. 1 or FIG. 4.

FIG. 6 shows an ion implantation system using the IHC ion source 10 of FIG. 1 or FIG. 4. As shown in FIGS. 1 and 4, disposed outside and proximate the extraction aperture of the IHC ion source 10 is one or more extraction electrodes 200. The one or more extraction electrodes 200 may be biased using extraction electrode power supply 201.

Located downstream from the extraction electrodes 200 is a mass analyzer 210. The mass analyzer 210 uses magnetic fields to guide the path of the extracted ions 1. The magnetic fields affect the flight path of ions according to their mass and charge. A mass resolving device 220 that has a resolving aperture 221 is disposed at the output, or distal end, of the mass analyzer 210. By proper selection of the magnetic fields, only those ions 1 that have a selected mass and charge will be directed through the resolving aperture 221. Other ions will strike the mass resolving device 220 or a wall of the mass analyzer 210 and will not travel any further in the system.

A collimator 230 may disposed downstream from the mass resolving device 220. The collimator 230 accepts the ions 1 that pass through the resolving aperture 221 and creates a ribbon ion beam formed of a plurality of parallel or nearly parallel beamlets. The output, or distal end, of the mass analyzer 210 and the input, or proximal end, of the collimator 230 may be a fixed distance apart. The mass resolving device 220 is disposed in the space between these two components.

Located downstream from the collimator 230 may be an acceleration/deceleration stage 240. The acceleration/deceleration stage 240 may be referred to as an energy purity module. The energy purity module is a beam-line lens component configured to independently control deflection, deceleration, and focus of the ion beam. For example, the energy purity module may be a vertical electrostatic energy filter (VEEF) or electrostatic filter (EF). Located downstream from the acceleration/deceleration stage 240 is the workpiece 250.

The embodiments described above in the present application may have many advantages. The IHC ion sources of FIGS. 3A-3B and 5D-5E enable a E×B drift of electrons in a rotational fashion. This reduces the number of electrons that are lost to the body of the arc chamber 100. By increasing the number of available electrons, more ionization can take place. Thus, the plasma density may be increased as compared to traditional IHC ion sources. Further, in each embodiment, the plasma potential is increased. An increase in plasma potential may result in greater plasma density. In one experiment, through the use of electrodes 300 or an extraction plate 103 that was biased at 10V, the plasma potential along the central axis 108 was increased about 7V as compared to a traditional IHC ion source. This resulted in an increase in plasma density of about 300% along the central axis 108. Greater plasma density may result in a higher extraction current, better fractionalization and lower plasma noise.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion source, comprising:
  a chamber, comprising:
    a body comprising a first end, a second end, a bottom and a plurality of walls;
    an indirectly heated cathode disposed at a first end of the chamber;
    an extraction plate comprising an extraction aperture having a width and a height through which ions are extracted, electrically isolated from the body, wherein the body and the extraction plate form a closed volume;
    one or more shielding electrodes disposed in the closed volume adjacent to and not in physical contact with the extraction plate and electrically connected to the body; and
    an extraction power supply in communication with the extraction plate, wherein the extraction plate is positively biased relative to the body;
    wherein the body and the one or more shielding electrodes form a circular or nearly circular cross-section in the chamber along a portion of the chamber.

2. The ion source of claim 1, wherein the one or more shielding electrodes are disposed above and below the extraction aperture along the width of the extraction aperture.

3. The ion source of claim 1, wherein an interior surface of the one or more shielding electrodes is curved.

4. The ion source of claim 3, wherein the bottom and the plurality of walls are a unitary component having a curved interior surface, such that the interior surface of the unitary component and the one or more shield electrodes form the circular or nearly circular cross-section in the chamber along the portion of the chamber.

5. The ion source of claim 4, wherein the circular or nearly circular cross-section extends along the width of the extraction aperture.

6. The ion source of claim 3, wherein the bottom and the plurality of walls are separate components, and further comprising curved electrodes disposed in corners formed between the bottom and each wall, wherein the curved electrodes are electrically connected to the body.

7. The ion source of claim 6, wherein exposed portions of the interior surface of the bottom, the plurality of walls, the curved electrodes and the one or more shield electrodes form the circular or nearly circular cross-section along the portion of the chamber.

8. The ion source of claim 7, wherein the circular or nearly circular cross-section extends along the width of the extraction aperture.

9. The ion source of claim 1, wherein the extraction plate is biased at a voltage that is 10V to 100V greater than a voltage of the body.

10. An ion implantation system, comprising:
  the ion source of claim 1;
  a mass analyzer; and
  an acceleration/deceleration stage.

11. An ion source, comprising:
  a chamber, comprising:
    a body comprising a first end, a second end, a bottom and a plurality of walls;
    an indirectly heated cathode disposed at a first end of the chamber;
    an extraction plate electrically connected to the body and comprising an extraction aperture having a width and a height through which ions are extracted, wherein the body and the extraction plate form a closed volume;
    two electrodes disposed in the closed volume adjacent to the extraction plate, wherein one electrode is disposed above the extraction aperture in a height direction and one electrode is disposed below the extraction aperture in the height direction; and
    an electrode power supply in communication with a first electrode of the two electrodes, wherein the first electrode is electrically isolated from the body and is positively biased relative to the body, and a second electrode is electrically connected to the body.

12. The ion source of claim 11, wherein the two electrodes comprise plates having a planar interior surface and a planar back surface and arranged parallel to the extraction plate.

13. The ion source of claim 11, wherein the two electrodes comprise plates having a planar interior surface and a planar back surface and disposed at an angle with respect to the extraction plate.

14. An ion source, comprising:
  a chamber, comprising:
    a body comprising a first end, a second end, a bottom and a plurality of walls;
    an indirectly heated cathode disposed at a first end of the chamber;
    an extraction plate electrically connected to the body and comprising an extraction aperture having a width and a height through which ions are extracted, wherein the body and the extraction plate form a closed volume;
    one or more electrodes disposed in the closed volume, wherein the one or more electrodes are disposed above the extraction aperture and below the extraction aperture in a height direction; and
    an electrode power supply in communication with at least one of the one or more electrodes, wherein an interior surface of the one or more electrodes is curved, and the one or more electrodes are disposed in or adjacent to corners formed at junctions between the body and the extraction plate.

15. The ion source of claim 14, wherein the bottom and the plurality of walls are a unitary component having a curved interior surface, such that the interior surface of the unitary component and the one or more electrodes form a circular or nearly circular cross-section along a portion of the chamber.

16. The ion source of claim 14, wherein the bottom and the plurality of walls are separate components, and further comprising curved electrodes disposed in corners formed between the bottom and each sidewall, wherein the curved electrodes are electrically connected to the body.

17. The ion source of claim 16, wherein exposed portions of the interior surface of the bottom, the plurality of walls, the curved electrodes and the one or more electrodes form a circular or nearly circular cross-section along a portion of the chamber.

18. The ion source of claim 14, wherein the one or more electrodes comprise two electrodes, and the two electrodes are biased at different voltages.

19. An ion implantation system, comprising:
the ion source of claim 14;
a mass analyzer; and
an acceleration/deceleration stage.

* * * * *